(12) United States Patent
Yang et al.

(10) Patent No.: US 12,193,164 B2
(45) Date of Patent: Jan. 7, 2025

(54) OXYGEN AND HUMIDITY CONTROL IN STORAGE DEVICE

(71) Applicant: Taiwan Semiconductor Manufacturing Co., Ltd., Hsinchu (TW)

(72) Inventors: Shen-Min Yang, Hsinchu (TW); Pu Kuan Fang, Zhubei (TW); Jyh-Shiou Hsu, Hsin-Chu (TW); Mu-Tsang Lin, Hemei Township (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 18/338,679

(22) Filed: Jun. 21, 2023

(65) Prior Publication Data

US 2023/0337365 A1 Oct. 19, 2023

Related U.S. Application Data

(62) Division of application No. 16/937,004, filed on Jul. 23, 2020, now Pat. No. 11,723,152.

(60) Provisional application No. 62/965,221, filed on Jan. 24, 2020.

(51) Int. Cl.
*H05K 3/00* (2006.01)
*H01L 21/673* (2006.01)

(52) U.S. Cl.
CPC ..... *H05K 3/0055* (2013.01); *H05K 2203/085* (2013.01); *H05K 2203/1178* (2013.01)

(58) Field of Classification Search
CPC ......... H01L 21/67389; H01L 21/67393; H01L 21/67017; H01L 21/6732; H01L 21/67383; H01L 21/673; H05K 2203/085; H05K 2203/1178; H05K 3/0055; H05K 3/00
USPC ............................................. 174/8; 206/711
See application file for complete search history.

(56) References Cited

U.S. PATENT DOCUMENTS

2007/0062647 A1   3/2007  Bailey et al.
2017/0207191 A1   7/2017  Huang et al.
2018/0374731 A1* 12/2018  Woo .................. H01L 21/67017

FOREIGN PATENT DOCUMENTS

CN    107062928 A  *  8/2017  ............... F28B 9/00
CN    207343358 U  *  5/2018  ............. B08B 13/00
KR    20100059238 A    6/2010

* cited by examiner

*Primary Examiner* — Timothy J Thompson
*Assistant Examiner* — Guillermo J Egoavil
(74) *Attorney, Agent, or Firm* — Sterne, Kessler, Goldstein & Fox P.L.L.C.

(57) ABSTRACT

The present disclosure describes a storage device including a top panel, a bottom panel, a back panel, a front panel, and two side panels configured to form an enclosed volume. The storage device further includes multiple slots disposed at inner surfaces of the two side panels and configured to hold a substrate, a gas diffuser disposed at an inner surface of the back panel and configured to provide a purge gas to the enclosed volume, an isolation gas device disposed on an inner surface of the top panel and adjacent to a top portion of the front panel, and an isolation gas line configured to connect the isolation gas device to the gas diffuser. The isolation gas device is configured to inject the purge gas into a front portion of the storage device and in a direction from the top panel toward the bottom panel.

20 Claims, 6 Drawing Sheets

OXYGEN AND HUMIDITY CONTROL IN STORAGE DEVICE

CROSS-REFERENCE TO RELATED APPLICATIONS

This application is a divisional application of U.S. patent application Ser. No. 16/937,004, titled "Oxygen and Humidity Control in Storage Device," filed on Jul. 23, 2020, which claims the benefit of U.S. Provisional Patent Application No. 62/965,221, titled "Control of Oxygen and Humidity by Iso-Foup," filed Jan. 24, 2020, the disclosures of which are incorporated by references in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices. Such scaling down has increased the complexity of semiconductor manufacturing processes and the demands for process and contamination control in semiconductor manufacturing systems.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Semiconductor wafers are subjected to different processes (e.g., wet etching, dry etching, ashing, stripping, metal plating, and/or chemical mechanical polishing) in different processing chambers during the fabrication of semiconductor devices. The wafers can be transported and stored (e.g., temporarily stored) in batches in wafer storage devices during intervals between the different processes. The wafers of each batch can be stacked vertically in the wafer storage devices and supported by support frames having multiple separate wafer shelves or slots in the storage devices. These storage devices, usually referred to as front-opening unified pods (FOUPs), need to provide a humidity- and environment-controlled space to maintain the integrity of the wafers and/or the fabricated layers on the wafers.

Moisture within the wafer storage devices from the surrounding atmosphere can react with residual materials on the wafers from different wafer processes and form defects in the fabricated layers on the wafers that can result in defective semiconductor devices, and hence, loss in production yield. For example, the wafers subjected to an etching process using chlorine or fluorine gases can have a by-product reaction with moisture in the form of water vapor, which can form silicon oxide condensation and hence defects in the fabricated layers. The relative humidity (RH) in a wafer storage device can reach a range from about 13% to about 30% by purging dry air into the wafer storage device. However, with advances in semiconductor technology, the dimensions of semiconductor devices decrease and the total surface area of the semiconductor devices increases, which can require lower RH in the wafer storage device to provide a suitable process window for semiconductor device manufacturing processes and uniform RH in the wafer storage device.

Additionally, oxygen within the wafer storage devices can oxidize exposed surfaces of semiconductor devices on the wafers after different wafer processes and affect production yield. For example, a thickness deviation of about 0.3 Å for an oxide layer in the work function metal of semiconductor devices due to different storage times can lead to a threshold voltage (Vt) deviation of about 7 mV for the semiconductor devices. An inert gas environment in the storage devices can control the oxidation process and provide a uniform oxide thickness across different semiconductor devices. A nitrogen equipment front-end module FOUP/interface (N2-EFEM F/I) device between the wafer storage devices and the processing chamber can maintain an inert gas environment in the wafer storage devices. However, N2-EFEM F/I devices may increase cost and are not available for every processing chamber. Moreover, the inert gas environment can have safety concerns (e.g., suffocation). In another example, a thickness variation of a $PO_3$ oxide layer in a semiconductor device can lead to a critical dimension variation of a fabricated structure on the wafers that can negatively impact a wafer acceptance test of the semiconductor devices. An oxygen environment in the wafer storage device can accelerate the oxidation reaction and result in a thickness saturation of the $PO_3$ oxide layer, thus reducing the critical dimension variation.

Further, contaminants in the form of particulates and/or chemical gases within the wafer storage devices can also result in defective wafers and hence, loss in production yield. These contaminants, which can be from chemicals outgassed from the fabricated layer materials, adhere to the interior surfaces of the wafer storage devices and subsequently, transfer back to the wafers in the subsequent process steps as the wafers are removed and returned to the wafer storage devices.

The present disclosure provides example storage systems with wafer storage devices that are configured to achieve and maintain a desired moisture-content and/or a desired gas environment within the interior volume of the wafer storage devices. In some embodiments, the wafer storage devices can include a top panel, a bottom panel, a front panel, a back panel, and two side panels. In some embodiments, the wafer storage devices can include an isolation gas device on the top panel to provide an isolation gas flow in a front portion of the wafer storage devices. The isolation gas flow can isolate the gas environment in the wafer storage devices from the environment outside of the wafer storage devices. In some embodiments, the isolation gas device can be an enclosed container and can have multiple openings evenly distributed on a bottom side to form an isolation gas flow uniformly distributed in the front portion of the wafer storage devices. In some embodiments, one or more gas lines can connect the isolation gas device to a gas diffuser, which can be further connected to a gas supply system via one or more inlets on the bottom panel, to direct a purge gas to the isolation gas device.

In some embodiments, the wafer storage devices can further include a vacuum device on the bottom panel, which can be connected to a gas exhaust system via one or more outlets on the bottom panel. In some embodiments, the vacuum device can have multiple openings evenly distributed on a top side to accelerate the venting of the purge gas in the wafer storage devices and maintain the isolation gas flow uniformly distributed in the front portion of the wafer storage devices. In some embodiments, a configuration of the multiple openings on the top side of the vacuum device can be similar to or the same as a configuration of the multiple openings on the bottom side of the isolation gas device. In some embodiments, the relative humidity in the wafer storage devices with the isolation gas devices and/or the vacuum devices can range from about 0.5% to about 5% when the front panel of the wafer storage devices is open. In some embodiments, the oxygen concentration in the wafer storage devices with the isolation gas devices and/or the vacuum devices can reach a level lower than about 100 parts per million (ppm) when the front panel of the wafer storage devices is open.

Figure 1A:
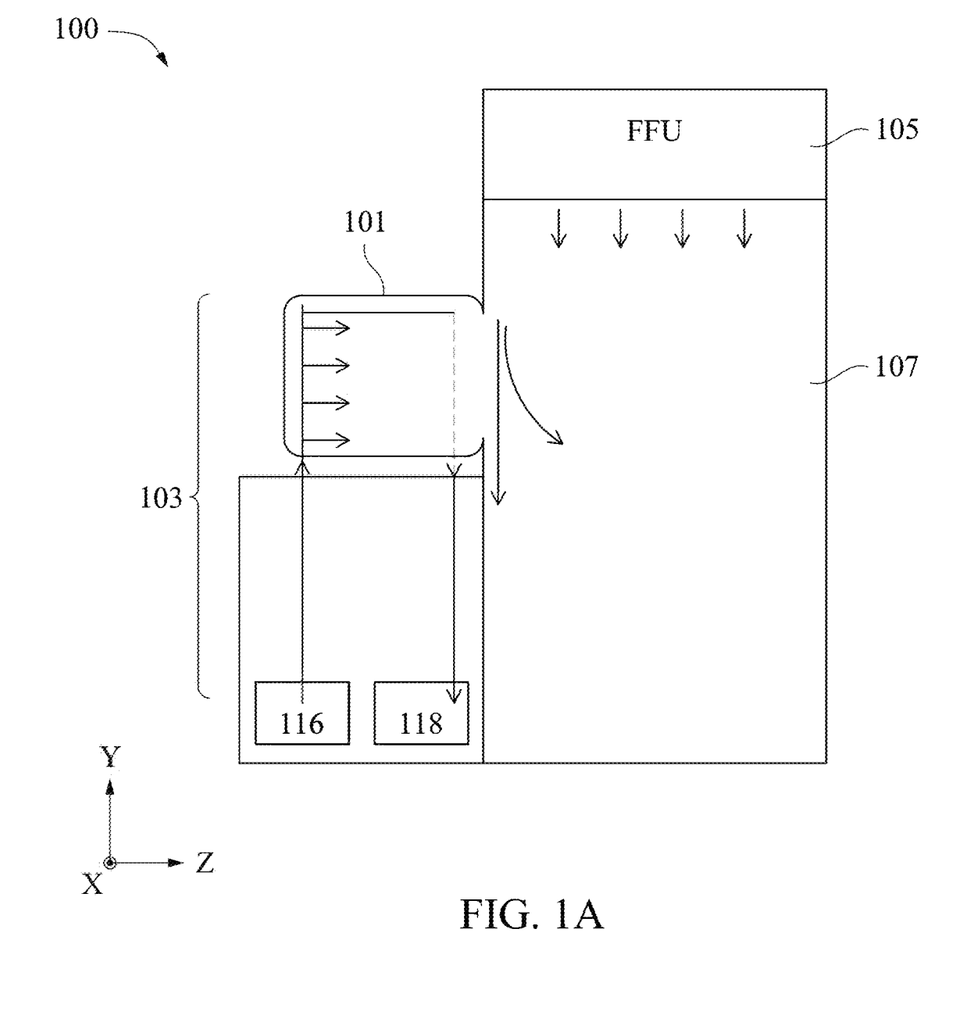
FIGS. 1A-1C illustrate a processing system with a wafer storage device and isometric views of the wafer storage device, in accordance with some embodiments.
Figure 1B:
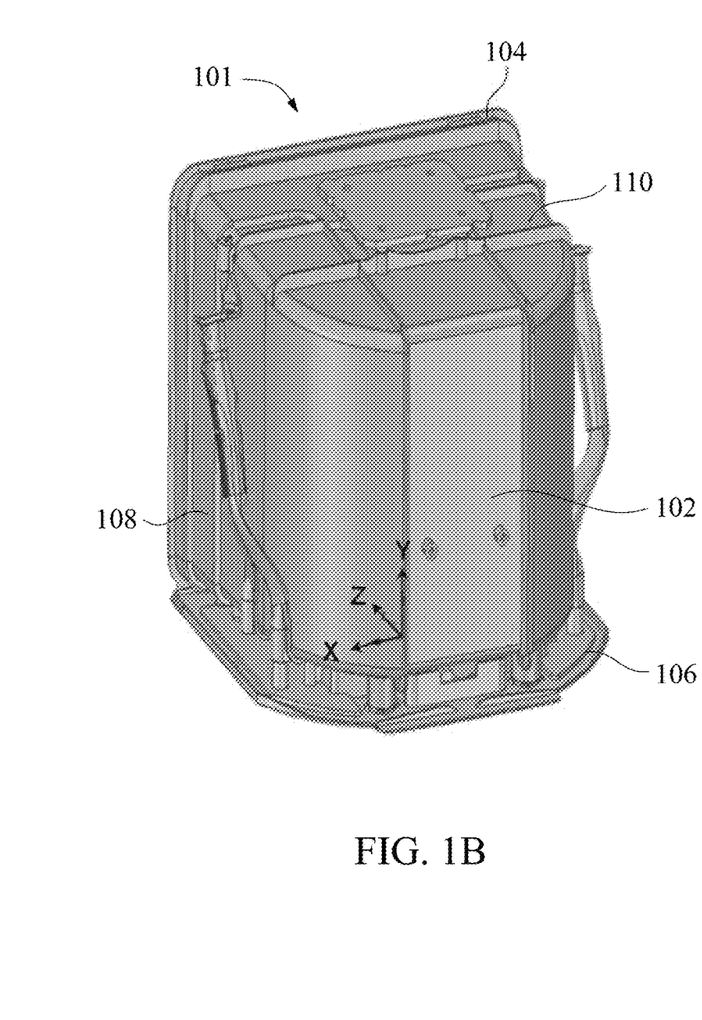
Figure 1C:
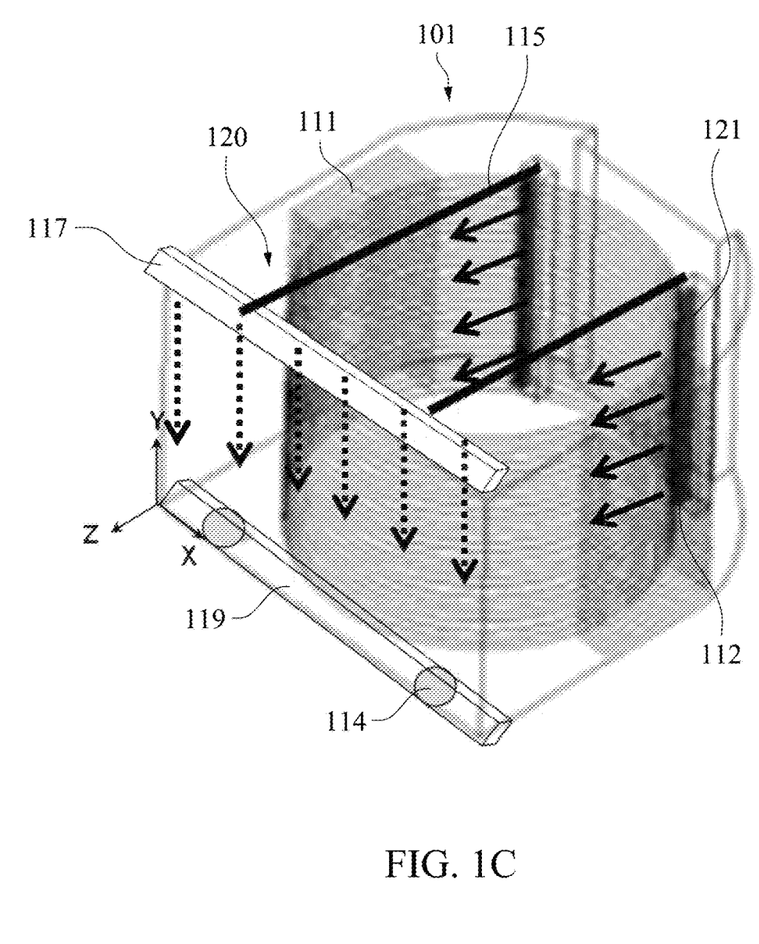

FIGS. 1A-1C illustrate a processing system 100 with a wafer storage device 101 and isometric views of wafer storage device 101, in accordance with some embodiments. Processing system 100 can include a wafer storage system 103, a fan filter unit (FFU) 105, and a processing chamber 107. FFU 105 can provide a controlled clean air flow with a uniform direction and speed in a semiconductor manufacturing environment (e.g., a clean room, a mini-environment, or a processing chamber). Processing chamber 107 can include semiconductor manufacturing tools to process wafers in wafer storage device 101. Wafer storage system 103 can further include wafer storage device 101, a gas supply system 116, and a gas exhaust system 118.

Wafer storage device 101 can be configured to transport and store (e.g., temporarily store) a batch of wafers (shown in FIG. 1C) that may be waiting to be processed. Wafer storage device 101 can be configured to maintain a desired relative humidity (e.g., equal to or less than about 5%) and/or gas environment in the interior volume of wafer storage device 101 to protect the wafers and/or fabricated layers on the wafers from moisture and contaminants, as well as to minimize oxide layer thickness variations between different wafers during manufacturing processes. As discussed above, moisture, if present above a desired relative humidity within wafer storage device 101, can react with residual materials on the wafers and form defects in the fabricated layers on the wafers that can result in defective semiconductor devices. Also, contaminants in the form of particulates and/or chemical gases, if present above a desired level within wafer storage device 101, can result in defective semiconductor devices. In addition, oxygen levels in desired ranges can minimize surface oxide thickness variations and improve production yield.

In some embodiments, as shown in FIGS. 1B and 1C, wafer storage device 101 can include a back panel 102, a front panel 104, a bottom panel 106, a top panel 110, and two side panels 108 having horizontal protrusions 111 (e.g., in the X-direction) extending outwardly from each of side panels 108. Back panel 102, front panel 104, bottom panel 106, top panel 110, and side panels 108 can be coupled to each other to form an enclosed volume 120 that holds a batch of wafers (as shown in FIG. 1C). Front panel 104 can be opened during wafer loading, wafer unloading, and purging of wafer storage device 101. An isolation gas flow in a front portion of wafer storage device 101 and adjacent to front panel 104 can be formed to isolate enclosed volume 120 within wafer storage device 101 from the outside environment and maintain a desired relative humidity and a desired gas environment in enclosed volume 120.

The batch of wafers can be stacked vertically (e.g., in the Y-direction) in enclosed volume 120 and each wafer can be supported by one of horizontal protrusions 111 on each of the side panels 108. Vertical spaces between adjacent protrusions 111 can be greater than the thickness of a wafer, such that each of the wafers can be stacked one over another. Each of horizontal protrusions 111 can be configured to support at least a portion of a wafer to prevent warping or damage to the wafer. In some embodiments, horizontal protrusions 111 can be configured to support a peripheral edge portion on opposing sides of each wafer to minimize contact with layers fabricated on the wafers as the wafers are loaded into and unloaded from wafer storage device 101.

Bottom panel 106 can include purge gas inlet and outlet ports 112 and 114, respectively. Though two inlet ports 112 and two outlet ports 114 are shown in FIG. 1C, bottom panel 106 can have less than or more than two inlet and two outlet ports similar to respective inlet and outlet ports 112 and 114. Purge gas inlet ports 112 can be configured to allow purge gas to be supplied to enclosed volume 120 to achieve a desired relative humidity and/or a desired gas environment while a batch of wafers is stored within enclosed volume 120 of wafer storage device 101. The purge gas can be vented from enclosed volume 120 through purge gas outlet ports 114. In some embodiments, the purge gas can include an inert gas such as nitrogen, argon, neon, and a combination thereof. In some embodiments, the purge gas can include clean dry air (CDA), oxygen ($O_2$), or other desired gases to satisfy processing requirements.

In some embodiments, back panel 102, front panel 104, bottom panel 106, top panel 110, side panels 108, and horizontal protrusions 111 can include polymeric materials such as transparent or opaque polycarbonate, polyvinyl chloride, and other suitable material. In some embodiments, one or more portions of back panel 102 can have semi-permeable membranes. The semi-permeable membranes can have microscopic pores with a maximum pore size of about 0.01 μm in diameter. In some embodiments, the diameters of the pores are in the range between about 0.005 μm and about 0.01 μm. The size of the microscopic pores in the semi-permeable membranes can be small enough to block and prevent particulate contaminants from entering into wafer storage device 101, but can be large enough to allow corrosive gas molecules from within wafer storage device 101 to diffuse out.

Referring to FIG. 1C, wafer storage device 101 can further include gas diffusers 121, isolation gas lines 115, an isolation gas device 117, and a vacuum device 119. Though two gas diffusers 121 and two isolation gas lines 115 are shown, wafer storage device 101 can have less than or more than two gas diffusers and two isolation gas lines similar to respective gas diffusers 121 and isolation gas lines 115.

Gas diffusers 121 can be disposed on back panel 102 and configured to diffuse the purge gas in enclosed volume 120. In some embodiments, gas diffusers 121 can have multiple openings on a side adjacent to the wafers in wafer storage device 101. In some embodiments, the multiple openings on the side of gas diffusers 121 can create a purge gas flow, direct the purge gas flow towards the wafers, and distribute the purge gas flow uniformly in enclosed volume 120. In some embodiments, the arrows coming out of gas diffusers 121 can indicate the directions of the purge gas flow. In some embodiments, gas diffusers 121 can be a porous tube having a diameter around about 13 mm and a length around about 24 mm.

Isolation gas lines 115 and isolation gas device 117 can be disposed on top panel 110 and create an isolation gas flow in a front portion of wafer storage device 101. Isolation gas lines 115 can connect isolation gas device 117 and gas diffusers 121 and direct the purge gas to isolation gas device 117. In some embodiments, isolation gas device 117 can be disposed on top panel 110 adjacent to front panel 104. In some embodiments, isolation gas device 117 can be an enclosed container having multiple openings on a side facing bottom panel 106. Isolation gas device 117 can inject the purge gas into the front portion of wafer storage device 101 and create the isolation gas flow in the front portion of wafer storage device 101. In some embodiments, the multiple openings can be evenly distributed on the side of isolation gas device 117 to create the isolation gas flow uniformly distributed in the front portion of wafer storage device 101. The isolation gas flow can flow in a direction from top panel 110 to bottom panel 106 and can be vented by vacuum device 119 to gas exhaust system 118 via outlets ports 114 on bottom panel 106.

In some embodiments, the isolation gas flow can isolate enclosed volume 120 from the environment outside of wafer storage device 101 when front panel 104 is open. In some embodiments, the isolation gas flow can control the relative humidity in enclosed volume 120 below about 5% and prevent the air flow generated by FFU 105, which can have a higher relative humidity (e.g., about 43%) and a higher oxygen concentration (e.g., about 20%), from entering enclosed volume 120. In some embodiments, the isolation gas flow can have a flow rate ranging from about 60 L/min to about 600 L/min. If the flow rate is less than about 60 L/min, the isolation gas flow may not be able to isolate enclosed volume 120 from the environment outside of wafer storage device 101. If the flow rate is greater than about 600 L/min, the isolation gas flow may cause particle contaminations and vibration of the wafers in wafer storage device 101. Moreover, wafer breakage can occur if the vibration of the wafers is higher than a desired range, especially for patterned wafers.

Vacuum device 119 can be disposed on bottom panel 106 adjacent to front panel 104. Vacuum device 119 can improve venting of the isolation gas flow and can help distribute the isolation gas flow uniformly in the front portion of wafer storage device 101. In some embodiments, vacuum device 119 can be disposed opposite to isolation gas device 117. In some embodiments, vacuum device 119 can have multiple openings on a side facing top panel 110. In some embodiments, the multiple openings can be evenly distributed on the side of vacuum device 119 to help distribute the isolation gas flow uniformly in the front portion of wafer storage device 101.

In some embodiments, isolation gas lines 115 can include suitable materials for wafer storage device 101, such as stainless steel and polyvinyl chloride (PVC). In some embodiments, isolation gas device 117 and vacuum device 119 can include suitable materials for wafer storage device 101, such as ultra-high molecular weight polyethylene (UPE). In some embodiments, to create an isolation gas flow uniformly distributed in the front portion of wafer storage device 101, isolation gas device 117 and vacuum device 119 can extend along an X-direction and both end portions of isolation gas device 117 and vacuum device 119 can abut side panels 108. In some embodiments, isolation gas device 117 and vacuum device 119 can have any geometric shape, such as a tube with a cross-section of a rectangle, a square, a circle, and an ellipsis.

Referring to FIG. 1A, gas supply system 116 can be configured to supply a purge gas into enclosed volume 120 through inlet ports 112 during a purging operation of wafer storage device 101. The arrow between gas supply system 116 and wafer storage device 101 can indicate the flow of the purge gas into wafer storage device 101. The purge gas can be supplied into enclosed volume 120 when a batch of wafers is loaded and enclosed within wafer storage device 101 to provide a desired relative humidity and/or a desired gas environment.

Gas exhaust system 118 can be coupled to purge gas outlet ports 114 and can be configured to vent the purge gas from within enclosed volume 120 through purge gas outlet ports 114. The venting of the purge gas can be performed by a vacuum pump of gas exhaust system 118. The arrow between gas exhaust system 118 and wafer storage device 101 can indicate the venting of the purge gas out of wafer storage device 101.

In some embodiments, the operations of gas supply and gas exhaust systems 116 and 118 can be controlled by a control system (not shown) based on one or more signals that indicate the presence of wafers within wafer storage device 101, the position of front panel 104, the pressure of purge gas within enclosed volume 120, the duration of purging, the relative humidity within wafer storage device 101, and/or the concentration of monitored gas (e.g., oxygen) within wafer storage device 101. In some embodiments, the control system can provide activation signals to gas supply and gas exhaust systems 116 and 118 simultaneously or with a time delay in response to receiving sensor signals that indicate the presence of wafers within wafer storage device 101 and a closed position of front panel 104. Similarly, deactivation signals can be provided by the control system to gas supply and gas exhaust systems 116 and 118 simultaneously or with a time delay in response to receiving sensor signals that indicate the absence of wafers within wafer storage device 101 and the closed position of front panel 104. In some embodiments, deactivation signals can be provided by the control system to gas supply and gas exhaust systems 116 and 118 simultaneously in response to receiving a sensor signal that indicates an open position of front panel 104. These sensor signals can be provided by one or more sensors (not shown) positioned on or within wafer storage device 101.

The activation and deactivation signals can be provided by the control system based on the relative humidity and/or monitored gas concentration within enclosed volume 120. In some embodiments, the control system can schedule gas supply and gas exhaust systems 116 and 118 to remain activated and/or deactivated for a desired time period when wafers are present within wafer storage device 101. However, gas supply and gas exhaust systems 116 and 118 can be activated from a scheduled or unscheduled deactivated state when wafers are present in response to the control system receiving a sensor signal from humidity and/or gas sensors indicating that the relative humidity and/or the monitored gas concentration, respectively, within enclosed volume 120 deviate from a desired range. Similarly, gas supply and gas exhaust systems 116 and 118 can be deactivated from a scheduled or unscheduled activated state when wafers are present in response to the control system receiving a sensor signal from the humidity and/or gas sensors indicating that the relative humidity and/or the monitored gas concentration, respectively, within enclosed volume 120 are within the desired range.

Figure 2:
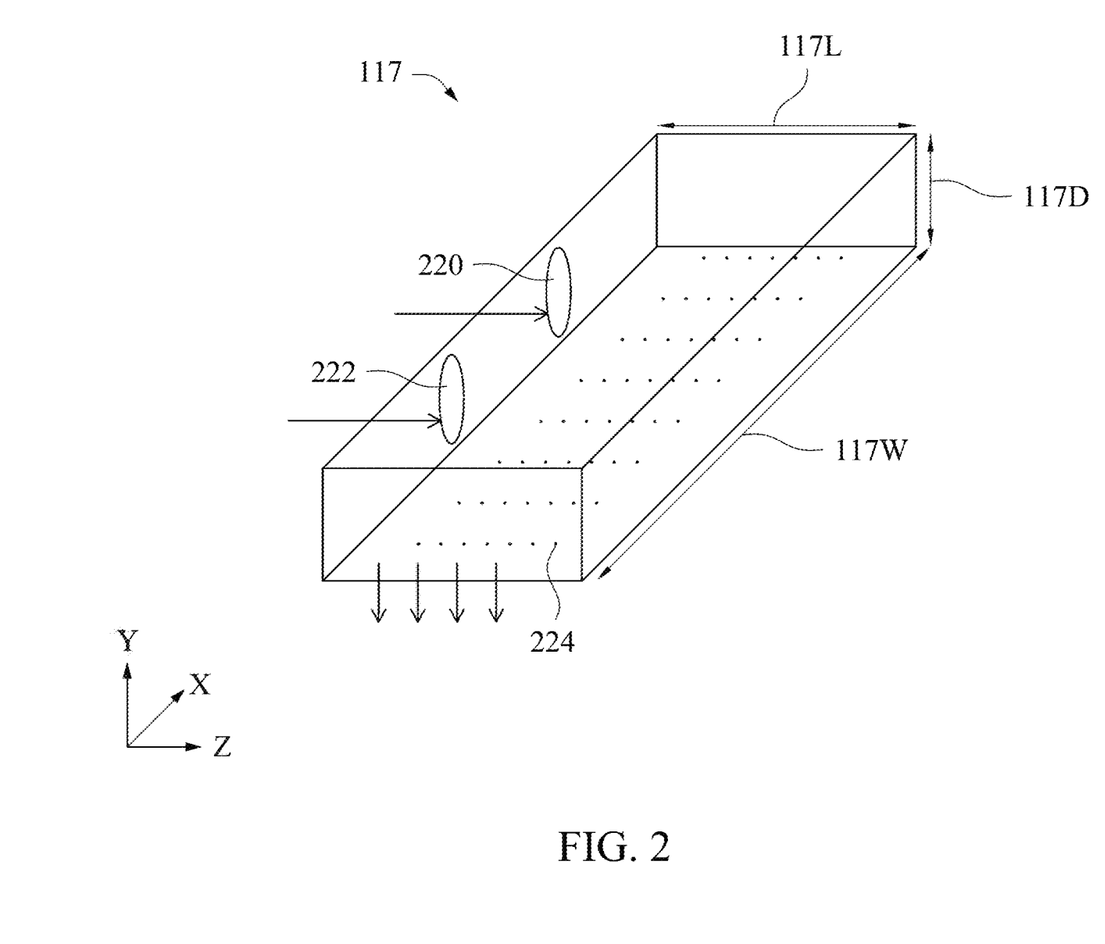
FIG. 2 illustrates an isometric view of an isolation gas device in a wafer storage device, in accordance with some embodiments.

FIG. 2 illustrates an isometric view of isolation gas device 117 in wafer storage device 101, in accordance with some embodiments. As shown in FIG. 2, isolation gas device 117 can be an enclosed container having six sides, with openings 220 and 222 on a left side and openings 224 on a bottom side adjacent to the left side. Openings 220 and 222 on the left side can connect to isolation gas lines 115, and the purge gas can flow into isolation gas device 117 via openings 220 and 222. The purge gas can flow out of isolation gas device 117 through openings 224 on the bottom side. In some embodiments, a dimension and a geometry shape of openings 220 and 222 can be determined based on a dimension and a geometry shape of isolation gas lines 115. In some embodiments, a diameter of openings 220 and 222 can range from about 5 mm to about 20 mm. In some embodiments, the bottom side can include multiple openings 224 evenly distributed on the bottom side. In some embodiments, openings 224 can have any geometry shape, such as a rectangle, a square, a circle, and an ellipsis. In some embodiments, a diameter of openings 224 can range from about 0.1 mm to about 40 mm.

In some embodiments, isolation gas device 117 can have a horizontal dimension 117L (e.g., length) along a Z-direction ranging from about 20 mm to about 50 mm. If horizontal dimension 117L is less than about 20 mm, isolation gas device 117 may not be able to provide an isolation gas flow, effectively isolating enclosed volume 120 from outside environment of wafer storage device 101. If horizontal dimension 117L is greater than about 50 mm, isolation gas device 117 may touch the wafers in wafer storage device 101 and cause additional vibration or breakage of the wafers.

In some embodiments, isolation gas device 117 can have a horizontal dimension 117W (e.g., width) along an X-direction ranging from about 250 mm to about 350 mm. Horizontal dimension 117W can be affected by a distance between side panels 108. If horizontal dimension 117W is less than about 250 mm, isolation gas device 117 may not be able to provide an isolation gas flow, effectively isolating enclosed volume 120 from outside environment of wafer storage device 101. If horizontal dimension 117W is greater than about 350 mm, isolation gas device 117 may not fit in wafer storage device 101.

In some embodiments, isolation gas device 117 can have a vertical dimension 117D (e.g., depth) along a Y-direction ranging from about 10 mm to about 30 mm. Vertical dimension 117D can be affected by a diameter of openings 220 and 222. If vertical dimension 117D is less than about 10 mm, isolation gas device 117 may not be able to connect to isolation gas lines 115. If vertical dimension 117D is greater than about 30 mm, isolation gas device 117 may block wafers transferring in and out of wafer storage device 101.

In some embodiments, an isolation gas flow can be created in the front portion of wafer storage device 101 with purge gas flowing out of openings 224 on the bottom side of isolation gas device 117. In some embodiments, with front panel 104 of wafer storage device 101 open, the isolation gas flow can isolate enclosed volume 120 from the environment outside of wafer storage device 101 and maintain a desired relative humidity and/or a desired gas environment in isolation gas device 117. As a result, compared with wafers in a wafer storage device without isolation gas device 117, wafers in wafer storage device 101 with isolation gas device 117 may not be damaged, contaminated, or have a larger deviation of oxide thickness across the wafers in wafer storage device 101.

FIGS. 3A-3D illustrate isometric views of various isolation gas devices 317A-317D in wafer storage device 101, in accordance with some embodiments. The above discussion of dimensions, materials, and geometries of isolation gas device 117 applies to isolation gas devices 317A-317D, unless mentioned otherwise. Isolation gas devices 317A-317D can have respective openings 322A-322D evenly distributed on respective bottom sides. In some embodiments, openings 322A-322D can be open having geometry shapes shown in FIGS. 3A-3D respectively. In some embodiments, openings 322A-322D can be a mesh structure with openings having a diameter ranging from about 0.1 mm to about 10 mm and geometry shapes shown in FIGS. 3A-3D respectively.

Figure 3A:
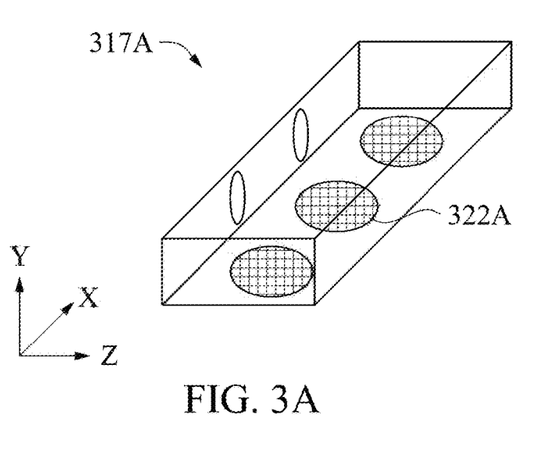
FIGS. 3A-3D illustrate isometric views of various isolation gas devices in a wafer storage device, in accordance with some embodiments.

In some embodiments, openings 322A can have a circular shape as shown in FIG. 3A. Though three openings 322A on the bottom side of isolation gas device 317A are shown in FIG. 3A, isolation gas device 317A can have less than or more than three openings on the bottom side similar to openings 322A. In some embodiments, a diameter of openings 322A can range from about 50 mm to about 100 mm.

Figure 3B:
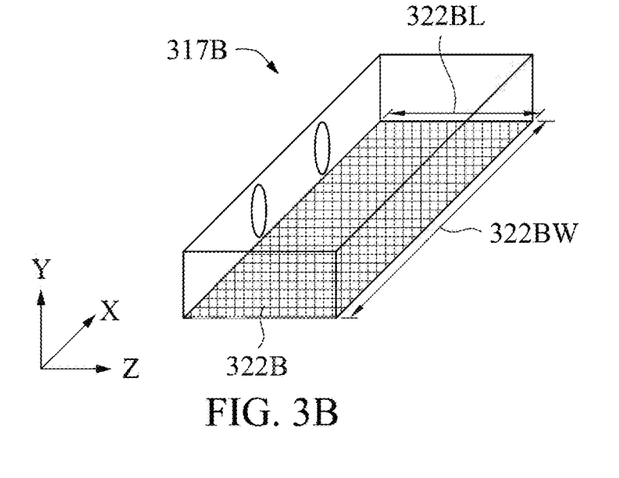

In some embodiments, referring to FIG. 3B, with opening 322B, the bottom side of isolation gas device 317B can be open. In some embodiments, opening 322B can have a horizontal dimension 322BW (e.g., width) along an X-direction ranging from about 250 mm to about 350 mm. In some embodiments, opening 322B can have a horizontal dimension 322BL (e.g., length) along a Z-direction ranging from about 20 mm to about 50 mm.

Figure 3C:
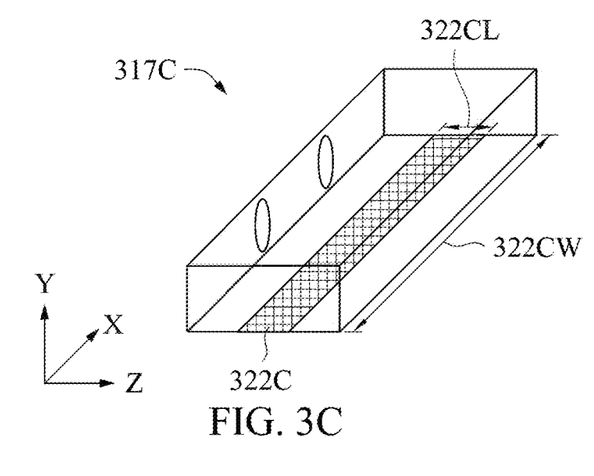

In some embodiments, opening 322C can have a rectangular shape extending along an X-direction to both ends of isolation gas device 317C, as shown in FIG. 3C. Though one opening 322C on the bottom side of isolation gas device 317C are shown in FIG. 3C, isolation gas device 317C can have more than one opening on the bottom side similar to opening 322C. In some embodiments, opening 322C can have a horizontal dimension 322CW (e.g., width) along an X-direction ranging from about 250 mm to about 350 mm. In some embodiments, opening 322C can have a horizontal dimension 322CL (e.g., length) along a Z-direction ranging from about 5 mm to about 50 mm. In some embodiments, opening 322C can be empty on the bottom side.

Figure 3D:
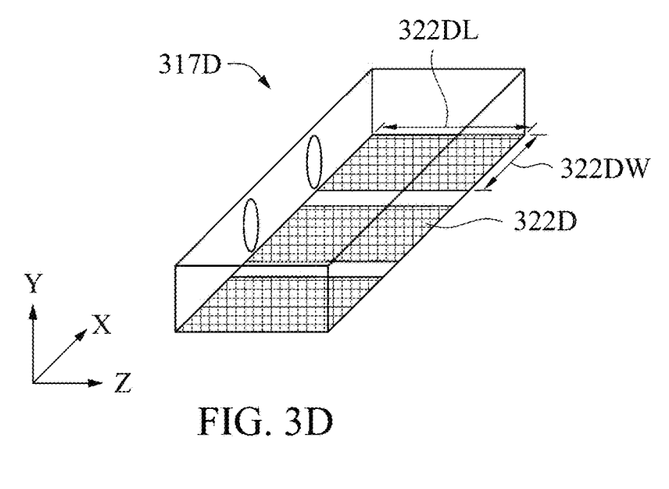

In some embodiments, openings 322D can have a rectangular shape extending along a Z-direction to both ends of isolation gas device 317D, as shown in FIG. 3D. Though three openings 322D on the bottom side of isolation gas device 317D are shown in FIG. 3D, isolation gas device 317D can have less than or more than three openings on the bottom side similar to openings 322D. In some embodiments, openings 322D can have a horizontal dimension 322DW (e.g., width) along an X-direction ranging from about 5 mm to about 100 mm. In some embodiments, openings 322D can have a horizontal dimension 322DL (e.g., length) along a Z-direction ranging from about 20 mm to about 50 mm.

Figure 4:
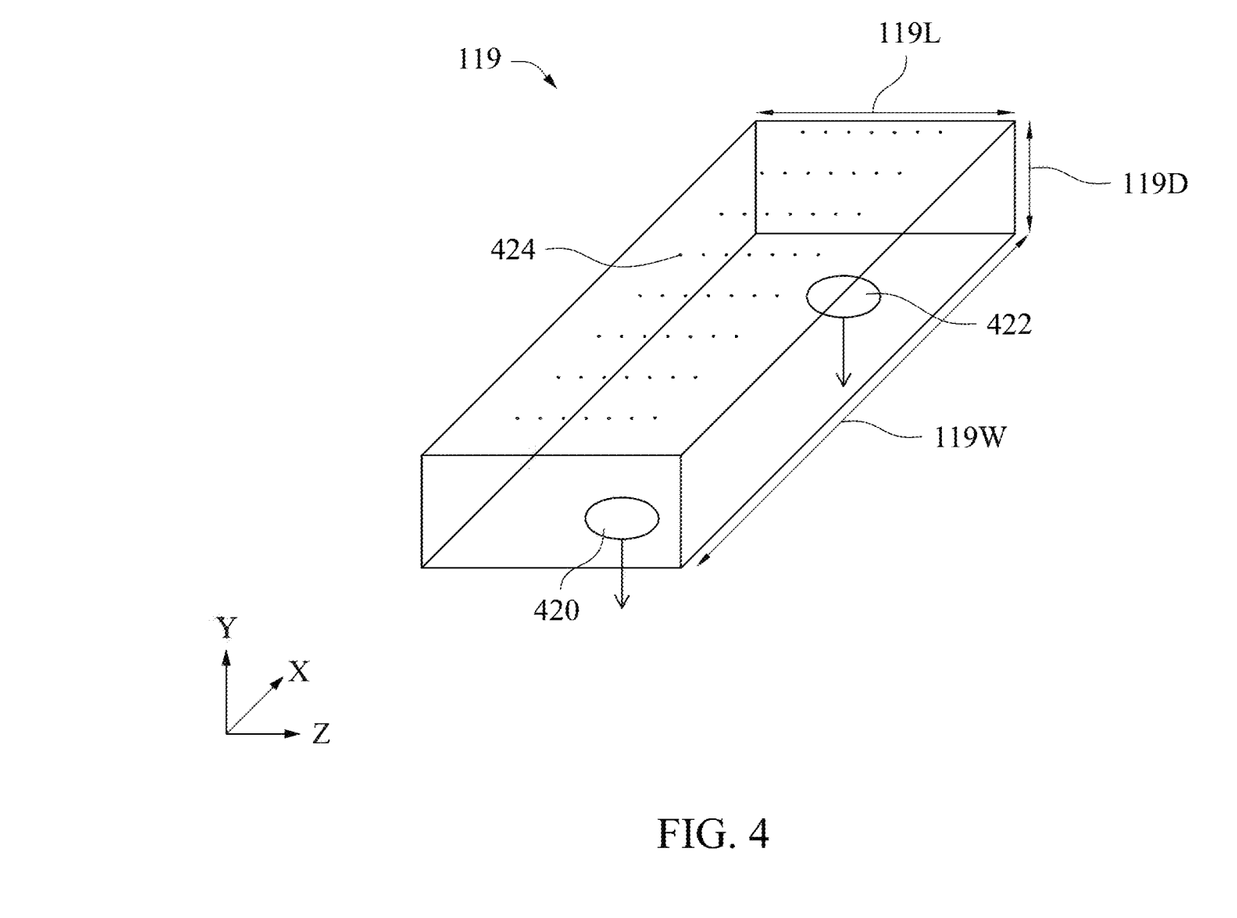
FIG. 4 illustrates a vacuum device in a wafer storage device, in accordance with some embodiments.

FIG. 4 illustrates vacuum device 119 in wafer storage device 101, in accordance with some embodiments. As shown in FIG. 4, vacuum device 119 can be an enclosed container having six sides, with openings 420 and 422 on a bottom side and openings 424 on a top side opposite to the bottom side. Openings 420 and 422 on the bottom side can connect to outlet ports 114 on bottom panel 106 and the purge gas in isolation gas device 117 can be vented to gas exhaust system 118 via openings 420 and 422. In some embodiments, a dimension and a geometry shape of openings 420 and 422 can be determined based on a dimension and a geometry shape of outlet ports 114. In some embodiments, a diameter of openings 420 and 422 can range from about 5 mm to about 20 mm. In some embodiments, the bottom side can include multiple openings 424 evenly distributed on the bottom side. The above discussion of geometries and dimensions of openings 224 applies to openings 424, unless mentioned otherwise. In some embodiments, the bottom side of vacuum device 119 can have openings 424 with geometries and dimensions similar to or the same as openings 322A-322D discussed above.

Figure 5:
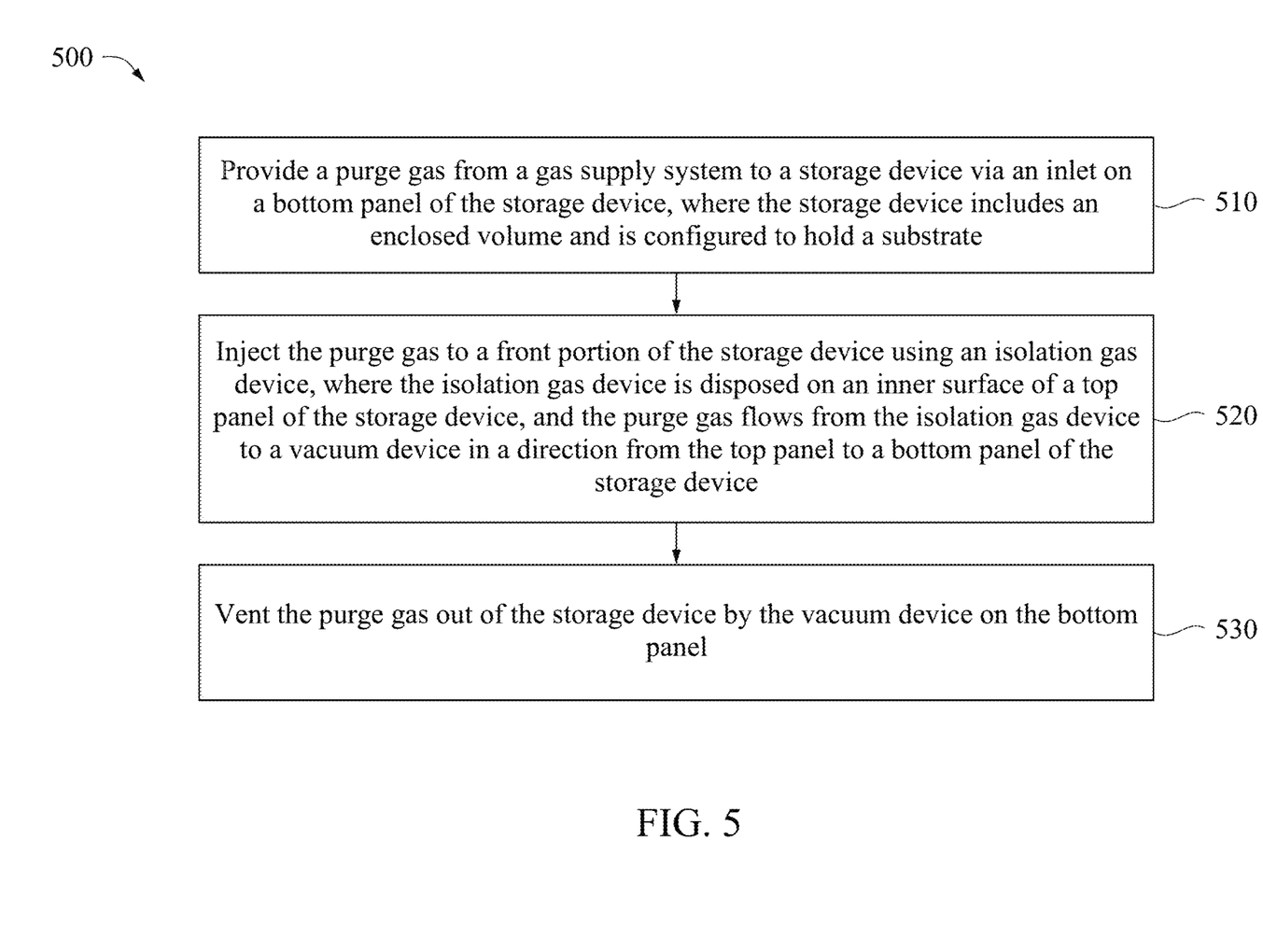
FIG. 5 illustrates a method of operating a wafer storage system having a wafer storage device, in accordance with some embodiments.

FIG. 5 illustrates a method 500 of operating wafer storage system 103 having wafer storage device 101, in accordance with some embodiments. Additional operations may be performed between various operations of method 500 and may be omitted merely for clarity and ease of description. Additionally, some of the operations may be performed simultaneously, or in a different order than the ones shown in FIG. 5. Accordingly, additional processes can be provided before, during, and/or after method 500. For illustrative purposes, the operations illustrated in FIG. 5 will be described with reference to the embodiments illustrated in FIGS. 1A-1C, 2, 3A-3D, and 4. However, method 500 is not limited to these embodiments.

In referring to FIG. 5, method 500 begins with operation 510, where a purge gas is provided from a gas supply system to a storage device via an inlet on a bottom panel of the storage device. The storage device includes an enclosed volume and is configured to hold a substrate. The substrate can include any suitable material for forming semiconductor device structures. For example, the substrate can include silicon, silicon germanium, silicon carbide, silicon-on-insulator (SOI), germanium-on-insulator (GOI), glass, quartz, gallium nitride, gallium arsenide, plastic sheet and/or other suitable III-V compound. The substrate can also be a semi-finished product from a semiconductor device fabrication process station. As shown in FIG. 1A-1C, a wafer can be held in wafer storage device 101 and a purge gas can be provided from gas supply system 116 to wafer storage device 101 via inlet ports 112 on bottom panel 106. The purge gas can be controlled by a control system and provided to wafer storage device 101 when front panel 104 is open or a relative humidity and/or a gas environment deviates from a desired range.

In operation 520, the purge gas is injected to a front portion of the storage device using an isolation gas device. The isolation gas device is disposed on an inner surface of a top panel of the storage device, and the purge gas flows from the isolation gas device to a vacuum device in a direction from the top panel to a bottom panel of the storage device. As shown in FIGS. 1A-1C, the purge gas can flow from gas supply system 116 into wafer storage device 101 through inlet ports 112 and to isolation gas device 117 through gas diffusers 121 and isolation gas lines 115. Isolation gas device 117 can be disposed on an inner surface of top panel 110 and can inject the purge gas into a front portion of wafer storage device 101. An isolation gas flow can be formed by the purge gas injected by isolation gas device 117. In some embodiments, the isolation gas flow can flow in a direction from top panel 110 to bottom panel 106.

In some embodiments, isolation gas device 117 can have multiple openings evenly distributed on a bottom side facing bottom panel 106. In some embodiments, isolation gas device 117 with the multiple openings can distribute the isolation gas flow uniformly in the front portion of wafer storage device 101. In some embodiments, the isolation gas flow can isolate enclosed volume 120 in wafer storage device 101 from the environment outside of wafer storage device 101 and maintain a desired relative humidity and/or a desired gas environment in isolation gas device 117. As a result, compared with wafers in a wafer storage device without isolation gas device 117, wafers in wafer storage device 101 with isolation gas device 117 may not be damaged, contaminated, or have a larger deviation of oxide thickness across the wafers in wafer storage device 101.

In operation 530, the purge gas is vented out of the storage device by the vacuum device on the bottom panel. As shown in FIGS. 1A-1C, vacuum device 119 can be disposed on bottom panel 106 and can be connected to outlet ports 114 on bottom panel 106. Vacuum device 119 can vent the purge gas out of wafer storage device 101 to gas exhaust system 118 through outlet ports 114. In some embodiments, vacuum device 119 can have multiple openings evenly distributed on a top side facing top panel 110. In some embodiments, vacuum device 119 can improve venting of the purge gas and can help distribute the isolation gas flow uniformly in the front portion of wafer storage device 101.

The above storage system and method of controlling relative humidity and gas environment in the storage system have been described with reference to a wafer storage system with a wafer storage device. The storage system and method of controlling relative humidity and gas environment in the storage system may be implemented in any type of storage device that requires a desired relative humidity and/or a desired gas environment for storing its contents. In some embodiments, storage devices for storing humidity-sensitive and/or gas-sensitive products, such as photosensitive chemicals, polymers, pharmaceuticals, reagents, wafer handling tools, or integrated circuit (IC) chips may implement a storage system similar to that of wafer storage system 103 with wafer storage device 101 discussed above.

The above embodiments describe example storage systems with wafer storage devices (e.g., wafer storage system 103 with wafer storage device 101) that are configured to achieve and maintain a desired moisture-content and/or a desired gas environment within the interior volume of the wafer storage devices (e.g., enclosed volume 120). In some embodiments, wafer storage device 101 can include top panel 110, bottom panel 106, front panel 104, back panel 102, and side panels 108. In some embodiments, wafer storage device 101 can include isolation gas device 117 on top panel 110 to provide an isolation gas flow in a front portion of wafer storage device 101. The isolation gas flow can isolate the gas environment in the wafer storage device (e.g., enclosed volume 120) from the environment outside of wafer storage device 101. In some embodiments, isolation gas device 117 can be an enclosed container and have multiple openings 224 evenly distributed on a bottom side to form an isolation gas flow uniformly distributed in the front portion of the wafer storage devices. In some embodiments, one or more gas lines (e.g., isolation gas lines 115) can connect isolation gas device 117 to gas diffusers 121, which can be further connected to gas supply system 116 via one or more inlets (e.g., inlet ports 112) on bottom panel 106, to direct the purge gas to isolation gas device 117.

In some embodiments, wafer storage device 101 can further include vacuum device 119 on bottom panel 106, which can be connected to gas exhaust system 118 via one or more outlets (e.g., outlet ports 114) on bottom panel 106. In some embodiments, vacuum device 119 can have multiple openings 424 evenly distributed on a top side to accelerate the venting of the purge gas in wafer storage device 101 and maintain the isolation gas flow formed by isolation gas device uniformly distributed in the front portion of wafer storage device 101. In some embodiments, a configuration of multiple openings 424 on the top side of vacuum device 119 can be similar to or the same as a configuration of multiple openings 224 on the bottom side of isolation gas device 117. In some embodiments, the relative humidity in wafer storage device 101 with isolation gas device 117 and/or vacuum device 119 can range from about 0.5% to about 5% when front panel 104 of wafer storage device 101 is open. In some embodiments, the oxygen concentration in the wafer storage devices with isolation gas device 117 and/or vacuum device 119 can reach a level lower than about 100 parts per million (ppm) when the front panel of wafer storage device 101 is open.

In some embodiments, a storage device includes a top panel, a bottom panel, a back panel, a front panel, and two side panels configured to form an enclosed volume, multiple slots disposed at inner surfaces of the two side panels and configured to hold a substrate, a gas diffuser disposed at an inner surface of the back panel and configured to provide a purge gas to the enclosed volume, an isolation gas device disposed on an inner surface of the top panel and adjacent to a top portion of the front panel, and an isolation gas line configured to connect the isolation gas device to the gas diffuser. The isolation gas device is configured to inject the purge gas into a front portion of the storage device and in a direction from the top panel toward the bottom panel.

In some embodiments, a storage system includes a storage device configured to store a substrate. The storage device includes multiple panels configured to form an enclosed volume and an isolation gas device disposed on an inner surface of a top panel of the multiple panels. A bottom panel of the multiple panels includes inlet and outlet ports. The isolation gas device is adjacent to a top portion of a front panel of the multiple panels and configured to inject a purge gas into a front portion of the storage device toward a bottom panel. The storage system further includes a gas supply system coupled to the inlet port and configured to supply the purge gas into the enclosed volume and a gas exhaust system coupled to the outlet port and configured to vent the purge gas out of the storage device.

In some embodiments, a method includes providing a purge gas from a gas supply system to a storage device via an inlet on a bottom panel of the storage device. The storage device includes an enclosed volume. The method further includes injecting the purge gas into a front portion of the storage device using an isolation gas device. The isolation gas device is disposed on an inner surface of a top panel of the storage device, and the purge gas flows from the isolation gas device to a vacuum device in a direction from the top panel to a bottom panel of the storage device. The method further includes venting the purge gas out of the storage device by the vacuum device on the bottom panel.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a purge gas from a gas supply system to a storage device via an inlet on a bottom panel of the storage device, wherein the storage device comprises a top panel opposite to the bottom panel;
   injecting the purge gas in a direction from the top panel to the bottom panel and into a front portion of the storage device using an isolation gas device, wherein the isolation gas device is disposed on an inner surface of the top panel of the storage device, and wherein the purge gas flows from the isolation gas device to a vacuum device on the bottom panel; and
   venting the purge gas out of the storage device by the vacuum device on the bottom panel.

2. The method of claim 1, further comprising distributing the purge gas in the storage device by a gas diffuser connected to the gas supply system via the inlet.

3. The method of claim 2, further comprising directing the purge gas from the gas diffuser to the isolation gas device by an isolation gas line on an inner surface of the top panel.

4. The method of claim 1, wherein the purge gas comprises one of oxygen, nitrogen, argon, and air.

5. The method of claim 1, wherein the venting the purge gas out of the storage device comprises venting the purge gas via an outlet port on the bottom panel connected to the vacuum device.

6. The method of claim 1, wherein the injecting the purge gas into the front portion of the storage device comprises:
   providing the purge gas into the isolation gas device through an inlet on a first side of the isolation gas device; and
   injecting the purge gas into the front portion of the storage device through one or more openings on a second side of the isolation gas device adjacent to the first side, wherein the one or more openings are distributed evenly on the second side.

7. The method of claim 6, wherein a shape of the one or more openings comprises one of a rectangular shape, a square shape, a circular shape, and an elliptical shape.

8. A method, comprising:
   forming an enclosed volume in a storage device with a top panel, a bottom panel, a back panel, a front panel, and two side panels;
   holding a substrate in the enclosed volume with a plurality of protrusions disposed at inner surfaces of the two side panels;
   providing a purge gas from a gas supply system to the enclosed volume via an inlet on the bottom panel;
   injecting the purge gas into a front portion of the storage device using an isolation gas device, wherein the isolation gas device is disposed on an inner surface of the top panel above the enclosed volume and adjacent to the front panel, and wherein the purge gas flows in a direction from the top panel to the bottom panel of the storage device; and
   venting the purge gas out of the storage device through the bottom panel.

9. The method of claim 8, further comprising distributing the purge gas in the storage device by a gas diffuser connected to the gas supply system via the inlet.

10. The method of claim 9, further comprising directing the purge gas from the gas diffuser to the isolation gas device by an isolation gas line on an inner surface of the top panel.

11. The method of claim 8, wherein the purge gas comprises one of oxygen, nitrogen, argon, and air.

12. The method of claim 8, wherein the venting the purge gas out of the storage device comprises venting the purge gas with a vacuum device via an outlet port on the bottom panel.

13. The method of claim 8, wherein the injecting the purge gas into the front portion of the storage device comprises:
   providing the purge gas into the isolation gas device through an inlet on a first side of the isolation gas device; and
   injecting the purge gas into the front portion of the storage device through one or more openings on a second side of the isolation gas device adjacent to the first side, wherein the one or more openings are distributed evenly on the second side.

14. The method of claim 8, wherein the injecting the purge gas into the front portion of the storage device comprises forming an isolation gas flow uniformly distributed in the front portion.

15. A method, comprising:
   providing a purge gas from a gas supply system to a storage device, wherein the storage device comprises a top panel and a bottom panel;
   directing the purge gas to an isolation gas device on an inner surface of the top panel, wherein the isolation gas device is connected to the gas supply system through a gas diffuser and an isolation gas line;
   forming an isolation gas flow with the isolation gas device in a front portion of the storage device, wherein the isolation gas flow is in a direction from the top panel to the bottom panel of the storage device; and
   venting the purge gas out of the storage device through the bottom panel.

16. The method of claim 15, further comprising distributing the purge gas in the storage device by the gas diffuser.

17. The method of claim 15, wherein the purge gas comprises one of oxygen, nitrogen, argon, and air.

18. The method of claim 15, wherein the venting the purge gas out of the storage device comprises venting the purge gas with a vacuum device on the bottom panel.

19. The method of claim 15, wherein the forming the isolation gas flow comprises:
   providing the purge gas into the isolation gas device through an inlet on a first side of the isolation gas device; and
   injecting the purge gas into the front portion of the storage device through one or more openings on a second side of the isolation gas device adjacent to the first side, wherein the one or more openings are distributed evenly on the second side.

20. The method of claim 15, wherein the forming the isolation gas flow comprises distributing the purge gas uniformly in the front portion of the storage device.

* * * * *